(12) United States Patent
Kirsch et al.

(10) Patent No.: US 7,035,605 B2
(45) Date of Patent: Apr. 25, 2006

(54) METHOD AND DEVICE FOR AUTOMATIC CONTROL OF THE FREQUENCY OF A LOCAL OSCILLATOR IN A DS-CDMA TYPE RECEIVER

(75) Inventors: Miguel Kirsch, Coppet (CH); Friedbert Berens, Genève (CH)

(73) Assignee: STMicroelectronics N.V., Amsterdam (NL)

( * ) Notice: Subject to any disclaimer, the term of this patent is extended or adjusted under 35 U.S.C. 154(b) by 468 days.

(21) Appl. No.: 10/621,030

(22) Filed: Jul. 16, 2003

(65) Prior Publication Data

US 2004/0058658 A1    Mar. 25, 2004

(30) Foreign Application Priority Data

Jul. 17, 2002    (EP) ................................. 02015921

(51) Int. Cl.
*H04B 17/02* (2006.01)
*H04B 1/18* (2006.01)

(52) U.S. Cl. ................ 455/136; 455/182.2; 455/192.2; 455/257; 375/344

(58) Field of Classification Search ................ 455/136, 455/182.2, 192.2, 257, 258, 63.1, 71; 375/344, 375/148

See application file for complete search history.

(56) References Cited

U.S. PATENT DOCUMENTS 5,594,754 A * 1/1997 Dohi et al. ................. 375/148

6,289,061 B1 * 9/2001 Kandala et al. ............. 375/344
6,571,088 B1 * 5/2003 Hasegawa ................ 455/182.2

(Continued)

FOREIGN PATENT DOCUMENTS

EP    0989687    3/2000

(Continued)

OTHER PUBLICATIONS

D'Andrea et al., *Design of Quadricorrelators for Automatic Frequency Control Systems*, IEEE Transactions on Communications, vol. 41, No. 6, Jun. 6, 1993, pp. 988-997, XP002225621.

Primary Examiner—Simon Nguyen
(74) Attorney, Agent, or Firm—Lisa K. Jorgenson; Allen, Dyer, Doppelt, Milbrath & Gilchrist, P.A.

(57) ABSTRACT

A method for controlling frequency of a local oscillator in a DS-CDMA type receiver includes transforming a known spread spectrum signal into a sampled digital signal formed of symbols with a despreaded frequency spectrum, and determining a residual frequency error $f_e$ for each symbol including a first residual frequency error $f_{e1}$. The method further includes correcting the frequency of the local oscillator with the residual frequency errors, and determining an average of absolute values of a predetermined number of successive residual frequency errors. The average is compared with a threshold, and if the average is greater than or equal to the threshold, the local oscillator frequency is corrected using an error equal to $-\text{sgn}(f_{e1})(1/T-|f_{e1}|)$, where sgn is the sign function, | | is the absolute value function and T is duration of a symbol before determining the next residual frequency error associated with the next symbol.

27 Claims, 2 Drawing Sheets

U.S. PATENT DOCUMENTS

| | | | |
|---|---|---|---|
| 6,639,939 B1 * | 10/2003 | Naden et al. | 375/140 |
| 6,704,552 B1 * | 3/2004 | Matsumoto | 455/164.1 |
| 6,704,555 B1 * | 3/2004 | Sih et al. | 455/245.1 |
| 6,731,911 B1 * | 5/2004 | Hirata et al. | 455/71 |
| 6,933,788 B1 * | 8/2005 | Forrester | 331/1 R |
| 2002/0177458 A1 * | 11/2002 | Hokao | 455/502 |
| 2003/0114110 A1 * | 6/2003 | Dahlback et al. | 455/67.1 |

FOREIGN PATENT DOCUMENTS

| | | |
|---|---|---|
| EP | 1071224 | 1/2001 |
| EP | 1217738 | 6/2002 |
| WO | 02/29978 | 4/2002 |

* cited by examiner

METHOD AND DEVICE FOR AUTOMATIC CONTROL OF THE FREQUENCY OF A LOCAL OSCILLATOR IN A DS-CDMA TYPE RECEIVER

FIELD OF THE INVENTION

The present invention relates to wireless communication systems, and in particular, to a wireless communication system operating according to the CDMA standard and one that includes a DS-CDMA type receiver with a local oscillator having automatic frequency control.

BACKGROUND OF THE INVENTION

In a wireless communication system, a base station communicates with several remote terminals such as mobile cell phones. Frequency division multiple access (FDMA) and time division multiple access (TDMA) are traditional multiple access schemes used to supply simultaneous services to a number of terminals. The basic idea in FDMA and TDMA systems is to respectively share the available resource at several frequencies or several time intervals so that several terminals can operate simultaneously without causing interference.

Telephones operating according to the GSM standard belong to FDMA and TDMA systems in the sense that transmission and reception takes place at different frequencies, and also at different time intervals. Unlike these systems using frequency division or time division, CDMA (code division multiple access) systems enable several users to share a common frequency and a common time channel by using a coded modulation. CDMA systems include the CDMA 2000 system, the WCDMA (Wide Band CDMA) system and the IS-95 standard.

A scrambling code is used in CDMA systems associated with each base station to distinguish one base station from another, as readily understood by one skilled in the art. Furthermore, an orthogonal code known as the OVSF code is allocated to each remote terminal such as a mobile cell phone, for example. All OVSF codes are orthogonal with each other so that one remote terminal can be distinguished from another.

Before a signal can be sent on the transmission channel to a remote terminal, the signal is scrambled and spread by the base station using the scrambling code for the base station and the OVSF code for the remote terminal. Consequently, the signal symbols are transformed into chips. The chip rate is higher than the symbol rate.

DS-CDMA systems refer to CDMA systems using spread spectrum signals. Conventionally, this type of receiver includes a radio frequency analog stage connected to an antenna to receive a spread spectrum signal.

The radio frequency stage comprises a low noise amplifier and two processing channels comprising mixers, filters and conventional amplifiers. The two mixers receive two corresponding signals at a phase difference of 90° from a phase locking loop comprising a local oscillator. After the frequency has been transposed in the mixers, the two processing channels define two paths I and Q, which are in quadrature. The signal is then transposed in the frequency base band of the signal.

After digital conversion in analog/digital converters, the I and Q paths are output to a reception processing stage that conventionally comprises a Rake receiver. The Rake receiver is typically used in mobile cell phones operating in a DS-CDMA communication system, and is used for time alignment, descrambling, despreading and a combination of delayed versions of the initial signals so as to output information contained in the initial signals.

The frequency transposition of the signal received in the base band usually leads to inaccuracies. This is mainly due to the quality of the local oscillator which then causes a residual frequency offset error. The digital processing stage of the receivers usually comprises an automatic frequency control (AFC) algorithm, the objective of which is to minimize the residual frequency error to bring it down to an acceptable value that has no influence on subsequent signal processing.

There are several available methods of frequency correction. Automatic frequency control techniques used in narrow band communications may be used for frequency control after despreading. Several methods are discussed in the following references: A. N. D'Andrea and U. Mengali, "Design Of Quadricorrelators For Automatic Frequency Control Systems", IEEE Trans. Commun., vol. 41, pp. 988–997, January 1993; M. L. Fowler and J. A. Johnson, "Extending The Threshold And Frequency Range For Phase-Based Frequency Estimation", IEEE Trans. Signal Processing, vol. 47, pp. 2857–2863, October 1999; and A. Wannasarnmaytha, S. Hara and N. Morinaga, "Two Step Kalman Filter Based AFC For Direct Conversation-Type Receiver In LEO Satellite Communications", IEEE Trans. Commun., vol. 49, pp. 246–253, January 2000.

However, performances of these techniques do not satisfy a number of requirements of third generation receivers designed to operate under the CDMA standard. For example, a wide correction frequency range, fast correction and low implementation complexity are not satisfied. More precisely, correction ranges of automatic frequency control techniques used in a narrow band are insufficient when the frequency is high and the frequency offset is of the order of the symbol rate, as in third generation wireless communication systems for example.

Automatic frequency control techniques with dual filters and with balanced quadricorrelators as disclosed in the D'Andrea et al. article use correction ranges on the order of the symbol rate. However, these techniques involve the use of complicated filters to eliminate inductive noise and require precise knowledge about the transmission channel.

Other automatic frequency control techniques (Jing Lei and Tung-Sang Ng, "New AFC Algorithm For A Fully-Digital MDPSK DS/CDMA Receiver", ISCAS 2001, vol. 4, pp. 294–297) also use correction ranges on the order of the symbol rate, but their implementation is very complex due to the fact that they must be applied before signal despreading.

SUMMARY OF THE INVENTION

In view of the foregoing background, an object of the present invention is to provide automatic frequency control for a local oscillator of a DS-CDMA type receiver with a low manufacturing complexity, and operating at the symbol level with a correction range on the order of the symbol rate which is approximately twice the correction range of automatic narrow band control techniques.

Another object of the present invention is to provide automatic frequency control that has a much faster and much more precise convergence than existing automatic frequency controls.

These and other objects, advantages and features in accordance with the present invention are provided by a process for automatic frequency control of a local oscillator of a DS-CDMA type receiver in which a known spread spectrum signal is received (for example, a pilot signal) that is transformed into a sampled digital signal formed from symbols and with a despreaded frequency spectrum. A residual frequency error is determined for each symbol. This error is filtered and the local oscillator frequency is corrected with this filtered error.

According to a general characteristic of the invention, the first determined residual frequency error $f_{e1}$ is memorized, and the average of the absolute values of a predetermined number of successive residual frequency errors is determined. This average is compared with a predetermined threshold. If this average is greater than the threshold, the local oscillator frequency is corrected with an error equal to $-\text{sgn}(f_{e1}) (1/T-|f_{e1}|)$, where sgn is the sign function, | | is the absolute value function and T is the duration of a symbol before determining the next residual frequency error associated with the next symbol.

Since residual frequency errors are advantageously filtered digitally, if the average is greater than the threshold, the memory of the digital filter is set to zero before the next residual frequency error is filtered.

Residual frequency errors are advantageously filtered with a first order matching filter. More precisely, when the estimated residual frequency error is large, this estimated error is not filtered at the limit. This causes fast convergence towards the frequency offset value, but obviously once this value has been reached, the oscillations around this value are large. The pass band of the matching filter also reduces when the frequency error reduces.

Thus, according to one embodiment, the current correction applied to the local oscillator is equal to (1−b) times the previous correction plus b times the current residual frequency error, and the coefficient b is chosen to be close to 1 if the current residual frequency error is greater than a first predetermined limiting value, whereas the coefficient b is chosen to be close to zero if the current residual frequency error is less than a second predetermined limiting value. For example, the first predetermined limiting value may be equal to the symbol rate divided by 7, for example.

The first and the second limiting values may be identical or they may be different. If they are different, several intermediate limiting values may be used between these two values, and they may be stored in a table so that the value of b can be reduced in steps, for example.

Another aspect of the present invention is directed to an automatic device for controlling the frequency of a local oscillator in a DS-CDMA type receiver comprising one input for receiving a known spread spectrum signal, and pre-processing means for transforming this signal into a sampled digital signal formed from symbols with a despreaded frequency spectrum. First calculation means determine a residual frequency error for each symbol. Filter means filters this error, and correction means corrects the frequency of the local oscillator with this filtered error.

According to one general characteristic of the invention, the device also comprises a memory to store the first determined residual frequency error $f_{e1}$, and second calculation means for determining the average of the absolute values of a predetermined number of successive residual frequency errors. Comparison means compares this average with a predetermined threshold, and if this average is greater than the threshold, the correction means corrects the frequency of the local oscillator with an error equal to $-\text{sgn}(f_{e1}) (1/T-|f_{e1}|)$, where sgn is the sign function, | | is the absolute value function, and T is the duration of a symbol before the first calculation means determines the next residual frequency error associated with the next symbol.

According to one embodiment, the filter means comprises digital filtering, and the device comprises control means that, if the average is greater than a threshold, will reset the memory of the digital filter before filtering the next residual frequency error.

Yet another aspect of the present invention is directed to a DS-CDMA type receiver comprising an automatic frequency control device as defined above. This type of receiver may be a mobile cell phone, for example.

BRIEF DESCRIPTION OF THE DRAWINGS

Other advantages and specific features of the invention will become clear after examining the detailed description of embodiments and uses which are in no way limiting, and the appended drawings in which.

DETAILED DESCRIPTION OF THE PREFERRED EMBODIMENTS

Figure 1:
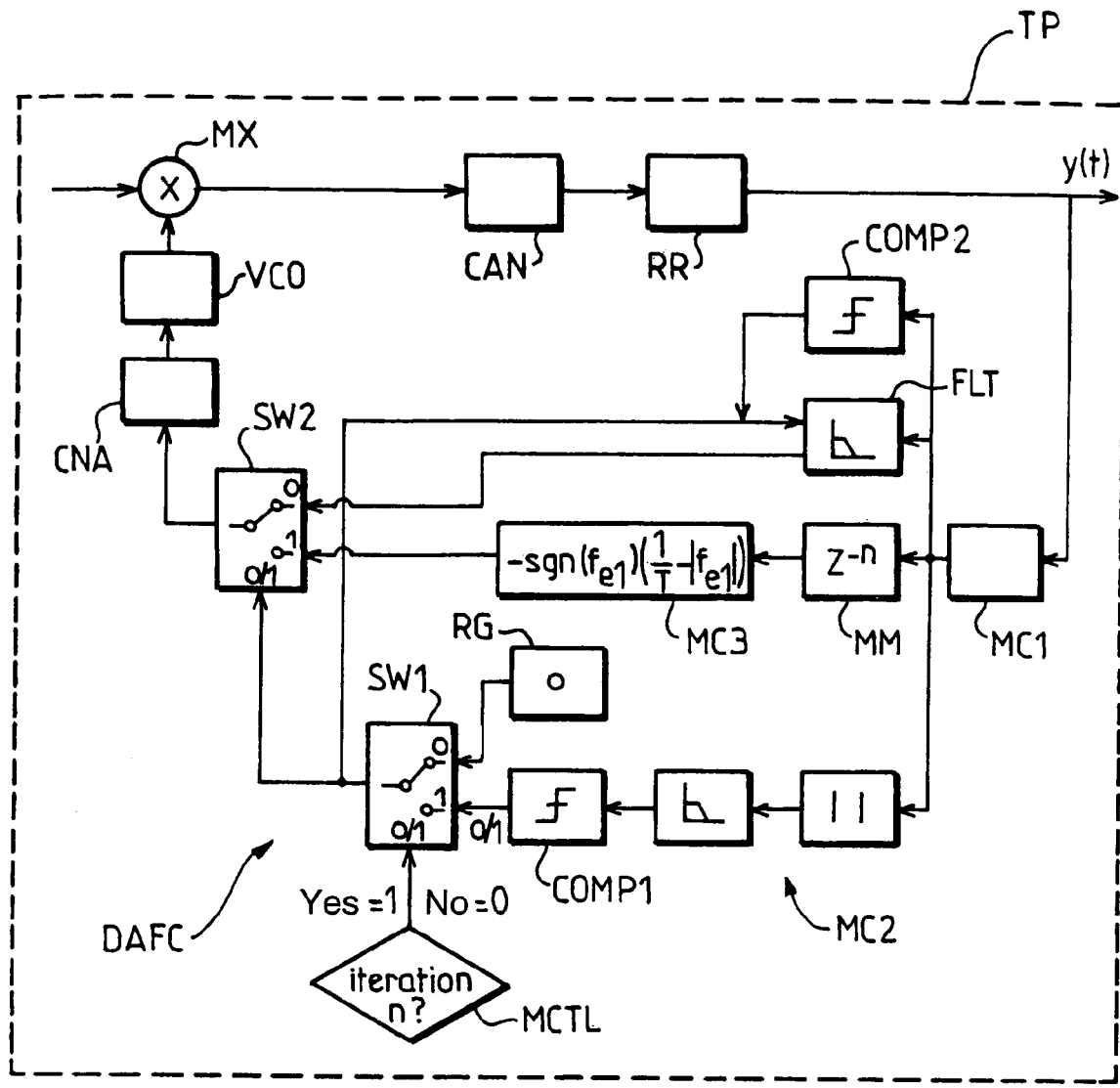
FIG. 1 is a block diagram of a device in accordance with the present invention.

In FIG. 1, the reference TP denotes a mobile cell phone belonging to a wireless DS-CDMA type communication system. Conventionally, the analog reception stage of the mobile cell phone TP comprises a mixer MX receiving the incident signal from the antenna. The mixer is preceded and followed by amplifiers, which are not shown in the figures simplify the drawing. Similarly, only one of the processing channels is shown in FIG. 1, which is processing channel 1.

The frequency transposition signal is derived from a phase locking loop comprising a local oscillator that is voltage controlled and is referenced VCO. After transposition of frequencies in the mixer MX and analog-digital conversion in an analog-digital converter CAN, the signal is a digital base band signal sampled at a sampling rate much higher than the symbol rate equal to 1/T (where T is the duration of a symbol). This digital signal is then output to a Rake receiver RR that in particular performs frequency despreading of the signal.

Thus, if it is considered that the mixer input signal is the pilot signal sequence, the signal y(k) may be modeled after despreading the pilot sequence using the following formula:

$$y(k)=\beta b(k)Ae^{j(\Phi(k)+\phi(k)+2\pi f_e(k))}+\eta(k) \qquad (I)$$

In this formula: $Ae^{j\Phi(k)}$ is the sequence transmitted to the pilot, where A is a real; $e^{j\phi(k)}$ is the phase distortion of the transmission channel; b(k) is the amplitude distortion of the channel; $f_e$ is the residual frequency error; and $\eta(k)$ is complex noise and $\beta$ is a real attenuation coefficient between 0 and 1 that decreases as the residual frequency error $f_e$ increases.

The digital stage of the mobile cell phone TP is provided with an automatic frequency control device DAFC, which is essentially performed via software within a processor. The role of this device DAFC is to respectively estimate successive frequency errors $f_e$ associated with successive symbols, and after digital-to-analog conversion in a CNA converter, to control the oscillator VCO to minimize (i.e., reduce) the residual frequency error. More precisely, the oscillator voltage is controlled so as to control its frequency, i.e., the frequency of the transposition signal output by this oscillator.

The device DAFC comprises first calculation means MC1 performed by software and is capable of determining a residual frequency error $f_e$ for each symbol. These successive frequency errors are determined conventionally by an autocorrelation of two consecutive symbols. This is well known to one skilled in the art, and therefore, will not be discussed in further detail.

In general, and unless mentioned otherwise below, each residual frequency error is filtered by a low pass digital filter FLT. Correction means includes a digital-to-analog converter CNA for correcting the local oscillator frequency with the filtered error.

Several cases can then arise. When the first determined residual frequency error is less than half of the symbol rate, in other words less than 1/2T, the corrections made by the device DAFC are good and the absolute values of successive residual frequency errors can converge towards 0. This is not the case when the first determined residual frequency error is more than 1/2T. However, the invention will overcome this problem as will be described in more detail below.

If we consider a pilot signal sequence despread in the frequency domain, it can be seen that since the pilot sequence has a constant value and the despreading process requires an averaging and under sampling operation, the complete process can be seen as a convolution of the pilot sequence in the time domain with a rectangle function over a time length equal to the duration of a symbol T, followed by under sampling from the chip rate towards the symbol rate 1/T.

In the frequency domain, this process leads to a spectrum resulting in the product (due to the constant value of the pilot sequence) with a (sin x)/x function in which the width of the main lobe is equal to 1/T, then all replicas of this spectrum with a frequency offset of k/T are summated together (for each integer value of k).

The spectral density obtained after despreading is not modified when there is a frequency shift error, but the Dirac corresponding to the pilot sequence is offset from the origin by an offset corresponding to the error. When the residual frequency error is less than 1/2T, there is no spectrum folding phenomenon, and in this case successive errors will converge towards zero as described above. However, when the absolute value of the residual frequency error is more than 1/2T, there is a spectrum folding phenomenon.

Figure 2:
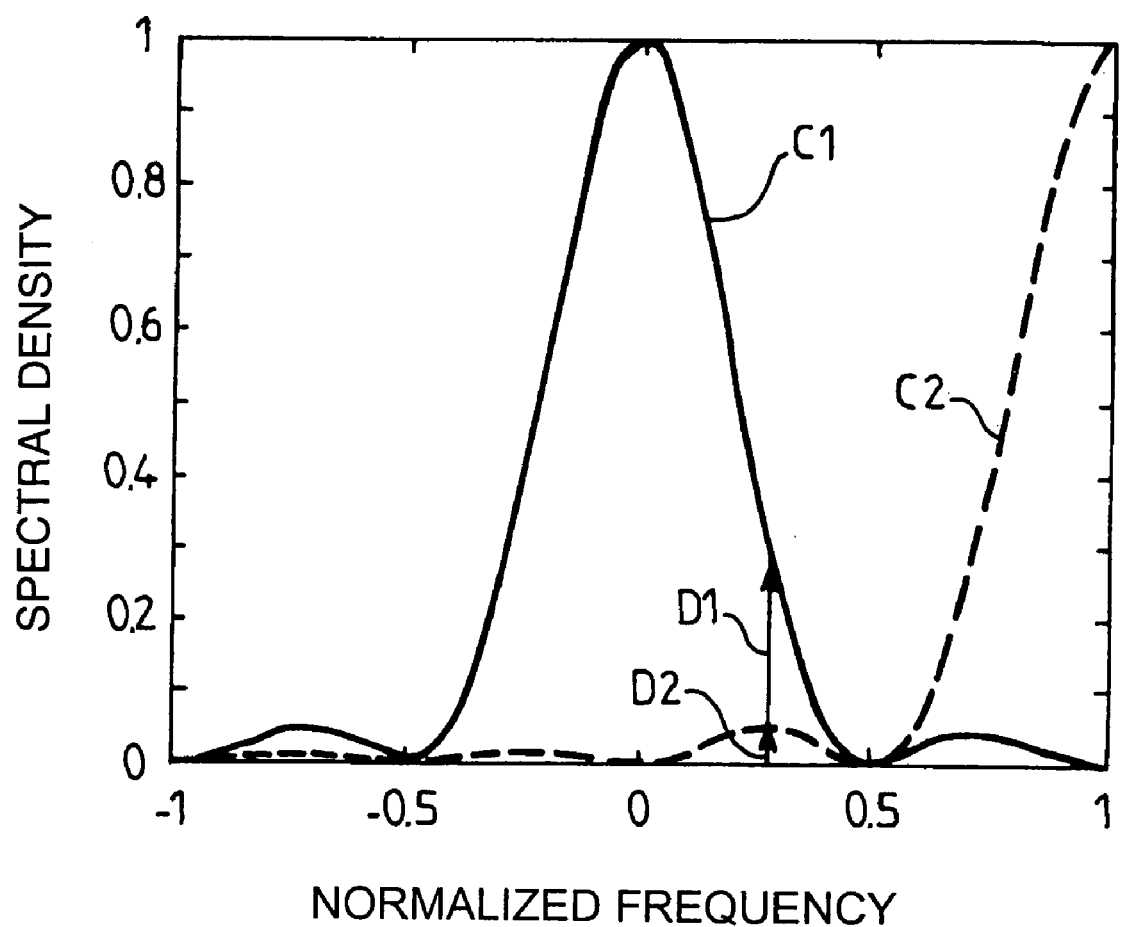
FIG. 2 is a graph of two curves illustrating one of the problems addressed by the present invention.

For example, suppose that there was frequency offset equal to $-1/2T-\Delta f$, where $0<\Delta f<1/2T$. Due to the folding, this frequency error will be interpreted incorrectly as being equal to $1/2T-\Delta f$. This is illustrated in FIG. 2, which shows superposition of the Dirac D1 corresponding to the frequency error equal to $1/2T-\Delta f$, and the Dirac D2 corresponding to the frequency error equal to $-1/2T-\Delta f$.

It can be seen in this example that there is also a large difference in the power between the folded Dirac D2 and the unfolded Dirac D1. With the unfolded signal, the estimate of the frequency error will be correct and its compensation will shift Dirac D1 towards the left towards a zero frequency error along curve C1, and by increasing its energy.

However, compensating the badly interpreted frequency error of the folded signal will also offset the Dirac D2 towards the left towards the origin, but the frequency error will increase at the same time. In this case, the already low energy of the signal will decrease towards zero along curve C2.

The decrease in the signal-to-noise ratio of the folded signal will be so high that the estimate of the frequency error will be very bad, which will cause large variations in the estimates of successive frequency errors. According to the invention, this large variation of residual frequency errors will be used to detect and correct frequency errors larger than the Nyquist frequency, in other words greater than 1/2T.

We will now look at this point again in more detail with reference once again to FIG. 1. The device DAFC comprises a memory MM that will be used to store the first determined residual frequency error $f_{e1}$. Furthermore, the calculation means MC3 will calculate a frequency error $F_{e1}'$ defined by formula (II) below:

$$f'_{e1} = -\mathrm{sgn}(f_{e1})\left(\frac{1}{T} - |f_{e1}|\right) \qquad \text{(II)}$$

In this formula, sgn denotes the sign function.

Furthermore, the second calculation means MC2 formed from an absolute value block followed by a low pass filter will determine the average of the absolute values of a predetermined number of successive residual frequency errors. More precisely, the current average z(k) is defined by the formula (III) below:

$$z(k) = \frac{1}{2}z(k-1) + \frac{1}{2}|x(k)| \qquad \text{(III)}$$

in which k denotes the current iteration corresponding to the current symbol, and x(k) is the current residual frequency error provided by first calculation means MC1.

Comparison means COMP1 can be used to compare the current average output by second calculation means MC2 with a predetermined threshold. If this average is less than the threshold, the comparison means COMP1 outputs the value 0. If this average is greater than the threshold, the comparison means COMP1 outputs the value 1.

The result of the comparison made with means COMP1 is examined after a predetermined number of iterations, in other words symbols have been carried out 5 or 6 iterations for example. Although this step is done by software, it is shown schematically in FIG. 1 by a register RG containing a constant value equal to 0, and by a switch SW1 that can be switched to input 0 or to input 1 as a function of the value of a control signal output by control means MCTL.

More precisely, as long as the predetermined number of iterations has not been reached, the value of the control signal is equal to zero which puts the switch SW1 to the corresponding input. Consequently, the value zero is output on the control input of a second switch SW2. Switch SW2 is then positioned to its input zero, which puts the output of the filter FLT into relation with the digital-to-analog converter CNA.

When the predetermined number of iterations has been reached, the control means MCTL sets the control signal controlling the switch SW1 to the logical value 1. This moves to its input 1. The value of the control signal of switch SW2 is then fixed by the value output by the comparator COMP1.

If this value is equal to 0, corresponding to an average less than the threshold, this means that successive residual frequency errors are converging. Consequently, the output of the filter FLT remains connected to the digital-to-analog converter CNA.

However, if the logical value output by the comparator COMP1 is equal to 1, this means that the average of the absolute values of successive frequency errors is greater than the threshold. Therefore, there is no convergence. Consequently, this means that it is very probable that the first stored residual frequency error $f_{e1}$ was not the real frequency error but was its folded version.

In this case, the switch SW2 is set to its input 1, and the local oscillator VCO is corrected using the residual frequency error $f_{e1}'$ determined by the calculation means MC3. Once this new correction has been applied, the next residual frequency errors drop to a value less than the Nyquist frequency, and the normal cycle starts again with the switch SW2 set to input 0 and the switch SW1 set to input 0. The residual frequency errors then converge towards zero. The memory of filter FLT is then reset to zero before the determined residual frequency error is filtered just after the correction $F_{e1}'$ has been applied.

For example, with a DS-CDMA type system with a carrier frequency of 2 GHz and a symbol rate of the controlled signal equal to 15 kHz which leads to a Nyquist frequency of 7.5 kHz, the value output by the comparator COMP1 after 5 iterations is used and the threshold value is fixed at 500 Hz.

The digital filter FLT is a first order low pass filter. More precisely, the current estimated frequency error c(k) output from the filter (in other words the current digital correction applied to the oscillator) is defined by formula (IV) below:

$$c(k)=(1-b)c(k-1)+bx(k) \quad (IV)$$

In this formula, x(k) is the current residual frequency error determined after correction by calculation means MC1. Moreover, b is a coefficient between 0 and 1.

This filter FLT is a matching filter in the sense that the coefficient b is dynamically defined. More precisely, for example, the residual frequency error determined by the calculation means MC1 is compared with a predetermined limiting value, which is shown by a comparator COMP2 in FIG. 1. For example, this predetermined limiting value may be equal to the symbol rate divided by 7. If the residual frequency error is greater than this predetermined limiting value, the coefficient b is chosen to be close to 1, for example equal to 1, while the coefficient b is chosen to be close to 0, for example equal to 0 if this residual frequency error is less than the predetermined limiting value. This can give fast convergence of the frequency error towards the target value and avoid oscillations about this target value.

Therefore, the invention can be used to correct residual frequency errors within a correction range equal to the symbol rate. In this respect, note that if the residual frequency error is close to the absolute value of the Nyquist frequency, the power of the offset Dirac is close to zero, and consequently it is very easy to make a bad estimate of this frequency error. However, this is not a problem for the device according to the invention.

If the estimate is completely wrong, it is always difficult to have a second estimate error close to the Nyquist frequency, and in this case either one of the two cases mentioned above will be applicable, in other words either a residual frequency error less than the Nyquist frequency, or with an absolute value greater than the Nyquist frequency. Furthermore, any other signal with known content other than the pilot signal can be used for frequency control according to the invention.

That which is claimed is:

1. A method for controlling frequency of a local oscillator in a DS-CDMA type receiver, the method comprising:
    transforming a known spread spectrum signal into a sampled digital signal formed of symbols with a despreaded frequency spectrum;
    determining a residual frequency error $f_e$ for each symbol including a first residual frequency error $f_{e1}$;
    filtering the residual frequency errors;
    correcting the frequency of the local oscillator with the filtered residual frequency errors;
    storing the first determined residual frequency error $f_{e1}$;
    determining an average of absolute values of a predetermined number of successive residual frequency errors; and
    comparing the average with a threshold, and if the average is greater than or equal to the threshold, the local oscillator frequency is corrected using an error equal to $-\text{sgn}(f_{e1})(1/T-|f_{e1}|)$, where sgn is the sign function, $||$ is the absolute value function and T is duration of a symbol before determining the next residual frequency error associated with the next symbol.

2. A method according to claim 1, wherein the residual frequency errors are digitally filtered with a digital filter, and if the average is greater than the threshold, the digital filter is set to zero before a next residual frequency error is filtered.

3. A method according to claim 1, wherein the residual frequency errors are filtered with a first order matching filter.

4. A method according to claim 1, wherein a current correction applied to the local oscillator is equal to (1−b) times a previous correction plus b times a current residual frequency error, and the coefficient b is chosen to be close to 1 if the current residual frequency error is greater than a first predetermined limiting value, and the coefficient b is chosen to be close to zero if the current residual frequency error is less than a second predetermined limiting value.

5. A method according to claim 4, wherein the first and second predetermined limiting values are equal to the symbol rate divided by 7.

6. A device for controlling frequency of a local oscillator in a DS-CDMA type receiver comprising pre-processing means for transforming a known spread spectrum signal into a sampled digital signal formed of symbols with a despreaded frequency spectrum, the device comprising:
    first calculation means for determining a residual frequency error $f_e$ for each symbol including a first residual frequency error $f_{e1}$;
    filter means for filtering the residual frequency errors;
    correction means for correcting the frequency of the local oscillator with the filtered residual frequency errors;
    memory means for storing the first residual frequency error $f_{e1}$;
    second calculation means for determining an average of absolute values of a predetermined number of successive residual frequency errors; and
    comparison means for comparing the average with a threshold, and if the average is greater than or equal to the threshold, the local oscillator frequency is corrected using an error equal to $-\text{sgn}(f_{e1})(1/T-|f_{e1}|)$, where sgn is the sign function, $||$ is the absolute value function and T is duration of a symbol before determining the next residual frequency error associated with the next symbol.

7. A device according to claim 6, wherein said filtering means comprises a digital filter; and further comprising control means for resetting said digital filter to zero before filtering a next residual frequency error if the average is greater than the threshold.

8. A device according to claim 6, wherein said filtering means comprises a first order matching filter.

9. A device according to claim 6, wherein a current correction applied to the local oscillator is equal to (1−b)

times a previous correction plus b times a current residual frequency error, and the coefficient b is chosen to be close to 1 if the current residual frequency error is greater than a first predetermined limiting value, and the coefficient b is chosen to be close to zero if the current residual frequency error is less than a second predetermined limiting value.

10. A device according to claim 9, wherein the first and second predetermined limiting values are equal to the symbol rate divided by 7.

11. A device according to claim 6, wherein said first calculation means, said filter means, said correction means, said memory means, said second calculation means and said comparison means are implemented within a processor.

12. A receiver comprising:
pre-processing circuitry for transforming a known spread spectrum signal into a sampled digital signal formed of symbols with a despreaded frequency spectrum;
a local oscillator connected to said pre-processing circuitry; and
a device for controlling frequency of said local oscillator, said device comprising
a first calculation circuit for determining a residual frequency error $f_e$ for each symbol including a first residual frequency error $f_{e1}$,
a correction circuit for correcting the frequency of the local oscillator with the residual frequency errors,
a second calculation circuit for determining an average of absolute values of a predetermined number of successive residual frequency errors, and
a comparison circuit for comparing the average with a threshold, and if the average is greater than or equal to the threshold, the local oscillator frequency is corrected using an error equal to $-\mathrm{sgn}(f_{e1})(1/T-|f_{e1}|)$, where sgn is the sign function, | | is the absolute value function and T is duration of a symbol before determining the next residual frequency error associated with the next symbol.

13. A receiver according to claim 12 wherein said device further comprises a memory for storing the first residual frequency error $f_{e1}$.

14. A receiver according to claim 12 wherein said device further comprises a filter for filtering the residual frequency errors.

15. A receiver according to claim 14, wherein said filter comprises a digital filter; and wherein said device further comprises a control circuit for resetting said digital filter to zero before filtering a next residual frequency error if the average is greater than the threshold.

16. A receiver according to claim 14, wherein said filter comprises a first order matching filter.

17. A receiver according to claim 12, wherein a current correction applied to said local oscillator is equal to (1−b) times a previous correction plus b times a current residual frequency error, and the coefficient b is chosen to be close to 1 if the current residual frequency error is greater than a first predetermined limiting value, and the coefficient b is chosen to be close to zero if the current residual frequency error is less than a second predetermined limiting value.

18. A receiver according to claim 17, wherein the first and second predetermined limiting values are equal to the symbol rate divided by 7.

19. A receiver according to claim 12, wherein the receiver is integrated within a mobile cell phone.

20. A mobile cell phone comprising:
an antenna; and
a receiver connected to said antenna for receiving a known spread spectrum signal, said receiver comprising
pre-processing circuitry for transforming the spread spectrum signal into a sampled digital signal formed of symbols with a despreaded frequency spectrum,
a local oscillator connected to said pre-processing circuitry, and
a processor for controlling frequency of said local oscillator by
determining a residual frequency error $f_e$ for each symbol including a first residual frequency error $f_{e1}$,
filtering the residual frequency errors, correcting the frequency of the local oscillator with the filtered residual frequency errors,
storing the first determined residual frequency error $f_{e1}$,
determining an average of absolute values of a predetermined number of successive residual frequency errors, and
comparing the average with a threshold, and if the average is greater than or equal to the threshold, the local oscillator frequency is corrected using an error equal to $-\mathrm{sgn}(f_{e1})(1/T-|f_{e1}|)$, where sgn is the sign function, | | is the absolute value function and T is duration of a symbol before determining the next residual frequency error associated with the next symbol.

21. A mobile cell phone according to claim 20 wherein said receiver comprises a DS-CDMA type receiver.

22. A mobile cell phone according to claim 20 wherein said processor comprises a memory for storing the first residual frequency error $f_{e1}$.

23. A mobile cell phone according to claim 20 wherein said processor filters the residual frequency errors before correcting the frequency of the local oscillator.

24. A mobile cell phone according to claim 23, wherein said processor resets the filtering to zero before filtering a next residual frequency error if the average is greater than the threshold.

25. A mobile cell phone according to claim 23, wherein the filtering corresponds to a first order matching filter.

26. A mobile cell phone according to claim 20, wherein a current correction applied to said local oscillator is equal to (1−b) times a previous correction plus b times a current residual frequency error, and the coefficient b is chosen to be close to 1 if the current residual frequency error is greater than a first predetermined limiting value, and the coefficient b is chosen to be close to zero if the current residual frequency error is less than a second predetermined limiting value.

27. A mobile cell phone according to claim 26, wherein the first and second predetermined limiting values are equal to the symbol rate divided by 7.

* * * * *